(12) United States Patent
Johnson et al.

(10) Patent No.: US 11,700,687 B2
(45) Date of Patent: Jul. 11, 2023

(54) POLYMER FILMS AND ELECTRONIC DEVICES

(71) Applicant: DUPONT ELECTRONICS, INC., Wilmington, DE (US)

(72) Inventors: Joseph Casey Johnson, Pickerington, OH (US); Delanie J Losey, Lancaster, OH (US); Peggy Scott, Circleville, OH (US); Christopher Dennis Simone, Pickerington, OH (US)

(73) Assignee: DUPONT ELECTRONICS, INC., Wilmington, DE (US)

( * ) Notice: Subject to any disclaimer, the term of this patent is extended or adjusted under 35 U.S.C. 154(b) by 0 days.

(21) Appl. No.: 16/899,504

(22) Filed: Jun. 11, 2020

(65) Prior Publication Data

US 2020/0396833 A1    Dec. 17, 2020

Related U.S. Application Data

(60) Provisional application No. 62/861,581, filed on Jun. 14, 2019.

(51) Int. Cl.
| | | |
|---|---|---|
| *H05K 1/03* | (2006.01) | |
| *B32B 15/08* | (2006.01) | |
| *B32B 27/28* | (2006.01) | |
| *C08L 79/08* | (2006.01) | |

(52) U.S. Cl.
CPC ........... *H05K 1/036* (2013.01); *B32B 15/08* (2013.01); *B32B 27/281* (2013.01); *H05K 1/0393* (2013.01); *C08J 2479/08* (2013.01); *C08L 79/08* (2013.01); *H05K 2201/0154* (2013.01); *Y10T 428/31681* (2015.04); *Y10T 428/31721* (2015.04)

(58) Field of Classification Search
None
See application file for complete search history.

(56) References Cited

U.S. PATENT DOCUMENTS

| | | | |
|---|---|---|---|
| 4,742,099 A | | 5/1988 | Nagano et al. |
| 4,778,872 A | * | 10/1988 | Sasaki ............... C08G 73/1007 525/436 |
| 4,883,718 A | * | 11/1989 | Ohta .................... B32B 15/08 428/458 |
| 5,166,308 A | * | 11/1992 | Kreuz ................ C08G 73/1042 528/125 |
| 5,218,034 A | | 6/1993 | Milligan |
| 5,227,244 A | | 7/1993 | Milligan |
| 5,298,331 A | | 3/1994 | Kanakarajan et al. |
| 5,543,222 A | | 8/1996 | Edman et al. |
| 6,956,098 B2 | | 10/2005 | Summers et al. |
| 2004/0058172 A1 | * | 3/2004 | Summers .......... C08G 73/1071 428/473.5 |
| 2007/0292701 A1 | * | 12/2007 | Kikuchi .................. C08J 5/18 428/458 |
| 2008/0044683 A1 | * | 2/2008 | Chan ...................... C08J 5/18 428/626 |
| 2008/0214777 A1 | * | 9/2008 | Poe ................... C08G 73/1042 528/347 |
| 2009/0197110 A1 | * | 8/2009 | Kikuchi ................. C09J 7/35 428/626 |
| 2013/0011645 A1 | * | 1/2013 | Carney ................ B32B 27/281 428/220 |
| 2013/0011687 A1 | * | 1/2013 | Matsutani ........... C08G 73/105 428/458 |
| 2018/0355172 A1 | * | 12/2018 | Uno ................... C08G 73/1042 |

OTHER PUBLICATIONS

Kinloch—copper-polyimide-copper laminate—J.Mat.Sci.—1989 (Year: 1989).*
Auman—copolyimides—TFMB—Mat.Res.Soc.—1994 (Year: 1994).*
Hougham—free volume of fluoro polyimides—Macro.—1996 (Year: 1996).*
Hasegawa—asymmetric biphenyl polyimides—Macromolecules—1999 (Year: 1999).*
Zeng—asymmetric polyimides—thermal properties—Macromol. Res.—2012 (Year: 2012).*
Auman—rod-like fluorinated polyimides—ACS Proc—2014 (Year: 2014).*
Poe—zero CTE polyimides—SPIE—changing rotational of monomers—2008 (Year: 2008).*
Kier, L.B., "An Index of Molecular Flexibilty from Kappa Shape Attributes", Quant. Struct.-Act. Relat. 8, pp. 221-224 (1989).

* cited by examiner

*Primary Examiner* — John Vincent Lawler

(57) ABSTRACT

In a first aspect, a polymer film includes a polyimide. The polyimide includes one or more dianhydrides and one or more diamines. Each of the dianhydrides and diamines is selected from the group consisting of crankshaft monomers, flexible monomers, rigid rotational monomers, rigid non-rotational monomers, and rotational inhibitor monomers. The polymer film has a $D_f$ of 0.005 or less, a water absorption of 2.0% or less and a water vapor transport rate of 50 $(g{\times}mil)/(m^2{\times}day)$ or less. In a second aspect, a metal-clad laminate includes the polymer film of first aspect and a first metal layer adhered to a first outer surface of the polymer film. In a third aspect, an electronic device includes the polymer film of the first aspect.

16 Claims, No Drawings

POLYMER FILMS AND ELECTRONIC DEVICES

FIELD OF DISCLOSURE

The field of this disclosure is polymer films and electronic devices.

BACKGROUND OF THE DISCLOSURE

The field of wireless communication and broadband technology has progressed dramatically with the growth in the market for portable electronic devices such as mobile phones and tablets. To meet the ever-increasing requirements of transmission data volume and speed, the transmission frequency of circuits is by necessity increasing. The polymeric materials used in these high-power electronic devices must satisfy a number of critical thermal, environmental, and electrical requirements to meet the required performance criteria for microelectronics applications. These desired attributes include thermal stability, low moisture uptake, high breakdown voltage (low leakage current), low dielectric constant and low dissipation factor. Polymers with these properties enable the use of advanced electronic packaging techniques, resulting in improved system performance and reliability. However, the integrity of high-frequency signals can be damaged by transmission loss. The dielectric loss of dielectric materials depends on their current frequency, dielectric constant ($D_k$), and dissipation factor ($D_f$). Consequently, the dielectric loss increases with an increase in the current frequency. The general method for reducing this loss is to use low $D_k$ and $D_f$ materials.

Dielectric constant is the ratio of the permittivity of a substance to that of free space. A material containing polar components, such as polar chemical bonds, which are presented as electric dipoles, has an elevated dielectric constant, in which the electrical dipoles align under an external electric filed. As a result, a capacitor with a dielectric medium of higher $D_k$ will hold more electric charge at the same applied voltage or, in other words, its capacitance will be higher. The dipole formation is a result of electronic polarization, distortion polarization, or orientation polarization in an alternating electric field. These phenomena have characteristic dependencies on the frequency of the alternating electric field, giving rise to a change in the real and imaginary part of the dielectric constant between the microwave, ultraviolet, and optical frequency range.

The dielectric loss tangent (tan ($\delta$)) is a measure of how much of the signal pulse (electromagnetic wave) propagating down a printed circuit board (PCB) transmission line will be lost in the dielectric region (insulating material between copper layers). Material datasheets and PCB manufacturers commonly refer to this signal loss as the dissipation factor ($D_f$). tan($\delta$) or $D_f$ is the result of electromagnetic wave absorption by the dielectric material and depends on the material's structure, electrical conduction, dielectric relaxation, dielectric resonance, and environmental effects. A lower loss tangent results in more of the original transmitted signal getting through to its destination. This is important for transceiver-based designs where multi-gigabit signals must be transmitted across long backplane channels. A large loss tangent means more dielectric absorption and less of the transmitted signal is getting through to its destination. Ideally, selecting the lowest loss material is the best choice for next generation electronics to minimize signal attenuation and achieve high data rates.

Many different polymers having good insulating properties and low dielectric constants have been used in electronic device applications. Thermoplastic materials, for example, fluorine resins, such as polytetrafluoroethylene (PTFE), or liquid crystal polymer (LCP), have been used. Their $D_k$'s and $D_f$'s are sufficiently low to minimize dielectric loss, but these thermoplastic materials present certain processability challenges, including drilling/laser compatibility, plating nonuniformity, melt squeeze out during copper lamination, and poor adhesive strength to copper. The ideal material will have low dielectric constant, low dissipation factor, and good film forming properties, high heat resistance, good adhesion to a variety of substrates, and very low moisture uptake. Other properties that are very important for many applications include low cost of manufacturing, low flammability, good chemical resistance, and the exclusion of residual ionic contamination such that dielectric properties are not compromised. Currently, there is no single material that fulfills all of these critical requirements.

SUMMARY

In a first aspect, a polymer film includes a polyimide. The polyimide includes one or more dianhydrides and one or more diamines. Each of the dianhydrides and diamines is selected from the group consisting of crankshaft monomers, flexible monomers, rigid rotational monomers, rigid non-rotational monomers, and rotational inhibitor monomers. The polymer film has a $D_f$ of 0.005 or less, a water absorption of 2.0% or less and a water vapor transport rate of 50 (g×mil)/(m²×day) or less. In a second aspect, a metal-clad laminate includes the polymer film of first aspect and a first metal layer adhered to a first outer surface of the polymer film. In a third aspect, an electronic device includes the polymer film of the first aspect.

The foregoing general description and the following detailed description are exemplary and explanatory only and are not restrictive of the invention, as defined in the appended claims.

DETAILED DESCRIPTION

In a first aspect, a polymer film includes a polyimide. The polyimide includes one or more dianhydrides and one or more diamines. Each of the dianhydrides and diamines is selected from the group consisting of crankshaft monomers, flexible monomers, rigid rotational monomers, rigid non-rotational monomers, and rotational inhibitor monomers. The polymer film has a $D_f$ of 0.005 or less, a water absorption of 2.0% or less and a water vapor transport rate of 50 (g×mil)/(m²×day) or less.

In one embodiment of the first aspect, the one or more dianhydrides include a first monomer that is a crankshaft monomer and a second monomer that is a rigid non-rotational monomer, the one or more diamines include a third monomer that is a flexible monomer, the crankshaft monomer and the flexible monomer are a combined 65 to 99 mol % of the total of all three monomers, and the rigid non-rotational monomer are 1 to 35 mol % of the total of all three monomers.

In another embodiment of the first aspect, the one or more dianhydrides include 50 mol % of a first monomer that is a crankshaft monomer or a flexible monomer. The one or more diamines include 1 to 40 mol % of a second monomer that is a rigid rotational monomer and 10 to 49 mol % of a third monomer that is a rotational inhibitor monomer. The mol % of each monomer is based on the total of all three monomers.

In yet another embodiment of the first aspect, the one or more dianhydrides include 50 mol % of a first monomer that is a crankshaft monomer. The one or more diamines include 15 to 25 mol % of a second monomer that is a rigid rotational monomer; and 25 to 35 mol % of a third monomer that is a flexible monomer or a crankshaft monomer. The mol % of each monomer is based on the total of all three monomers.

In still another embodiment of the first aspect, the one or more dianhydrides include 50 mol % of a first monomer that is a crankshaft monomer. The one or more diamines include 1 to 15 mol % of a second monomer that is a rotational inhibitor monomer, 25 to 44 mol % of a third monomer that is a rigid rotational monomer and 1 to 15 mol % of a fourth monomer that is a flexible monomer. The mol % of each monomer is based on the total of all four monomers.

In still yet another embodiment of the first aspect, the one or more dianhydrides include 30 to 49 mol % of a first monomer that is a crankshaft monomer and 1 to 20 mol % of a second monomer that is a rigid non-rotational monomer or a flexible monomer. The one or more diamines include 5 to 20 mol % of a third monomer that is a rotational inhibitor monomer and 30 to 45 mol % of a fourth monomer that is a rigid rotational monomer. The mol % of each monomer is based on the total of all four monomers.

In a further embodiment of the first aspect, the one or more dianhydrides include 15 to 35 mol % of a first monomer that is a crankshaft monomer and 15 to 35 mol % of a second monomer that is a flexible monomer. The one or more diamines include 1 to 35 mol % of a third monomer that is a rotational inhibitor monomer and 15 to 49 mol % a fourth monomer that is a rigid rotational monomer. The mol % of each monomer is based on the total of all four monomers.

In yet a further embodiment of the first aspect, the one or more dianhydrides include 40 to 49 mol % of a first monomer that is a crankshaft monomer and 1 to 10 mol % of a second monomer that is a rigid non-rotational monomer. The one or more diamines include 35 to 49 mol % of a third monomer that is a rigid rotational monomer and 1 to 15 mol % of a fourth monomer that is a rotational inhibitor monomer, a flexible monomer or a crankshaft monomer. The mol % of each monomer is based on the total of all four monomers.

In still a further embodiment of the first aspect, the one or more dianhydrides includes 30 to 49 mol % of a first monomer that is a crankshaft monomer and 1 to 20 mol % of a second monomer that is a rigid non-rotational monomer. The one or more diamines include 5 to 35 mol % of a third monomer that is a rotational inhibitor monomer, 1 to 20 mol % of a fourth monomer that is a flexible monomer and 1 to 40 mol % of a fifth monomer that is a rigid rotational monomer or a rigid non-rotational monomer. The mol % of each monomer is based on the total of all five monomers.

In still yet a further embodiment of the first aspect, the one or more dianhydrides includes 30 to 40 mol % of a first monomer that is a crankshaft monomer and 10 to 20 mol % of a second monomer that is a flexible monomer. The one or more diamines includes 1 to 15 mol % of a third monomer that is a first rotational inhibitor monomer, 25 to 40 mol % of a fourth monomer that is a rigid rotational monomer and 1 to 20 mol % of a fifth monomer that is a flexible monomer or a second rotational inhibitor monomer. The mol % of each monomer is based on the total of all four monomers.

In another embodiment of the first aspect, the polymer film has a thickness in the range of from 10 to 150 μm.

In a second aspect, a metal-clad laminate includes the polymer film of first aspect and a first metal layer adhered to a first outer surface of the polymer film.

In one embodiment of the second aspect, the metal-clad laminate further includes a second metal layer adhered to a second outer surface of the polymer film.

In a third aspect, an electronic device includes the polymer film of the first aspect.

Many aspects and embodiments have been described above and are merely exemplary and not limiting. After reading this specification, skilled artisans appreciate that other aspects and embodiments are possible without departing from the scope of the invention. Other features and advantages of the invention will be apparent from the following detailed description, and from the claims.

The polymer films of the present invention include polyimides having a type of out-of-plane orientation along the polyimide backbone structure to provide a low dielectric dissipation factor without unduly diminishing other critical properties. The films of the present invention are particularly well suited for use as substrates for supporting fragile metal layers having precise patterns and dimensions.

The substrates of the present invention comprise at least one film with a particular type of base polymer. "Base polymer" as used herein is intended to mean the dominant polymer component (at least 50, 55, 60, 65, 70, 75, 80, 85, 90, 95 or 100 weight percent of all polymers present in the film). Generally speaking, the base polymer will be at least 25, 30, 35, 40, 45, 50, 55, 60, 65, 70, 75, 80, 85, 90, 95 or 100 weight percent of the overall film.

The base polymer of the present invention is a polyimide synthesized by a poly-condensation reaction, involving the reaction of one or more aromatic diamine components with one or more aromatic dianhydride components.

As used herein, an "aromatic" monomer is intended to mean a monomer having at least one aromatic ring, either alone (i.e., a substituted or unsubstituted, functionalized or unfunctionalized benzene or similar-type aromatic ring) or connected to another (aromatic or aliphatic) ring. An aromatic backbone chain segment is intended to mean at least one aromatic moiety between two adjacent imide linkages.

Depending upon context, "diamine" as used herein is intended to mean: (i) the unreacted form (i.e., a diamine monomer); (ii) a partially reacted form (i.e., the portion or portions of an oligomer or other polymer precursor derived from or otherwise attributable to diamine monomer) or (iii) a fully reacted form (the portion or portions of the polymer derived from or otherwise attributable to diamine monomer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be functionalized with additional amine moieties (in addition to the amine moieties at the ends of the monomer that react with dianhydride to propagate a polymeric chain). Such additional amine moieties could be used to crosslink the polymer or to provide other functionality to the polymer.

Similarly, the term "dianhydride" as used herein is intended to mean the component that reacts with (is complimentary to) the diamine and in combination is capable of reacting to form an intermediate (which can then be cured into a polymer). Depending upon context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester functionality (or any other functionality presently known or developed in the future which is) capable of conversion to anhydride functionality.

Depending upon context, "dianhydride" can mean: (i) the unreacted form (i.e. a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polymer composition reacted from or otherwise attributable to dianhydride monomer) or (iii) a fully reacted form (the portion or portions of the polymer derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polymer). Such additional anhydride moieties could be used to crosslink the polymer or to provide other functionality to the polymer.

In polyimide synthesis, each polymerized monomer (when polymerized into a polyimide backbone between two other monomers) will generally form nitrogen-benzene imide linkages (on each side of the polymerized monomer). For the aromatic polyimides of the present invention these nitrogen-benzene linkage pairs will be either: (i) collinear anti-parallel; (ii) crankshaft anti-parallel; or (iii) non-anti-parallel.

"Anti-parallel" is intended to mean parallel but oriented in opposite directions. "Anti-parallel" is also intended to mean "substantially" anti-parallel whereby the imputed angle formed by the two nitrogen-benzene bonds (for the polyimide) or the two C—N bonds (of amine end groups of the diamine monomer) is about 180°±up to 5, 10, 15, 20, 25 or 30°.

Polyimide backbone configurations are difficult, if not impossible to fully verify, and therefore for purposes of this invention, the polyimide backbone configuration is defined primarily (and preferably, solely) by the type of monomers used in creating the polyimide.

The polyimides of the present invention are synthesized by polymerizing: (i) aromatic crankshaft monomers, aromatic flexible monomers, or both aromatic crankshaft and aromatic flexible monomers; and (ii) one or more other monomers selected from the group consisting of rigid rotational monomers, rigid non-rotational monomers, and rotational inhibitor monomers.

A "crankshaft monomer" is a monomer that has reactive ends that are also anti-parallel, but in contra-distinction to collinear monomers (where the ends are not offset), the reactive ends of the crankshaft monomer are also "offset".

For purposes of the present invention, crankshaft monomers have or form "ends" that are offset and anti-parallel. When the monomer is incorporated into a polyimide polymer, these "ends" are typically nitrogen-benzene linkages (or substituted derivations thereof) at adjacent imide (or imide-like) moieties along the polyimide polymer. In monomer form, the crankshaft monomer ends typically form a crankshaft conformation via the C—N bonds at the reactive ends of the monomer (the reactive ends that are used to propagate a polymeric chain). A thorough description of crankshaft monomer embodiments is discussed in U.S. Pat. No. 6,956,098 B2.

Polyimides containing the crankshaft conformation provide an anti-parallel offset that is theoretically at least one-fourth, one-fifth, one-sixth, one-seventh or one-eighth of the average bond length between the two crankshaft ends. While the offset distance can perhaps (at least theoretically) be calculated somewhat precisely for a particularly crankshaft monomer, these distances are believed to change (or be significantly affected) after the monomer is polymerized into a polyamic acid or a polyimide, due to steric and other interactions between the crankshaft along the polymer chain and the surrounding polymeric matrix.

Hence, a precise offset distance for any particular crankshaft along any particular polymer chain within any particular polyimide or polymeric matrix, would be very difficult, perhaps impossible (and certainly impractical) to calculate or predict. Indeed, for purposes of the present invention, it is only critical that certain amounts of certain types of crankshaft monomers be used when polymerizing the polyimides. Whether or not crankshafts are actually formed along the resulting polymer chains is not critical to the present invention.

Indeed, it may be (theoretically) possible that surrounding rod-like polymer segments may force a crankshaft segment into more of a rod-like configuration and these forces or interactions (rather than any actual crankshaft configuration) may provide many, or all, of the advantages of the present invention. Hence, the crankshaft monomers of the present invention certainly provide unexpected advantages, especially out-of-plane crystal orientation and chain packing, but it is not a critical aspect of the present invention that these monomers form any particular backbone configuration—crankshaft, pseudo-crankshaft or otherwise.

While not intending to be bound by any particular theory, often the crankshaft conformation of any given crankshaft monomer defines a lower thermodynamic energy state than most, if not all, non-crankshaft conformations. Therefore, it seems possible, if not probable, that the crankshaft monomers of the present invention preferentially form crankshaft backbone segments along the polyimide polymer and that such crankshafts are perhaps compressed into a somewhat rod-like configuration, due to the rigid, rod-like polymer segments connected to or surrounding the crankshaft segment.

However, polyimide backbone configurations are difficult, perhaps impossible, to fully and precisely measure. So, it is not a requirement of the present invention that any particular polyimide backbone configuration, or conformation, be obtained or verified. Rather, the present invention recognizes that crankshaft monomers when polymerized with monomers selected from flexible, rigid rotational, rigid non-rotational, and rotational inhibitor monomers (optionally also a small mole percent of other monomers) can be combined in accordance with the present invention to provide a polyimide polymer having unexpected and advantageous properties, particularly for electronics type applications.

The crankshaft, flexible, rigid rotational, rigid non-rotational, and rotational inhibitor monomers of the present invention each tend to contribute to preferred polymer orientations, morphologies and packing efficiencies. While not intended to be held to (or limited by) any particular theory concerning the present invention, it is theorized that during polymerization, film formation, and/or imidization:

1. The crankshaft monomer (if it assumes a less preferred non-crankshaft conformation) causes a change in direction of the polymer chain, thereby allowing or creating polymer segments with high rigidity to polymerize along different directions and disrupting (at least to some extent) the otherwise highly rod-like nature of the polymer matrix (this would then indicate a lowering of the packing density and/or in-plane orientation, of the polymeric material which in turn might explain the increased out-of-plane orientation and efficient packing believed to suppress dielectric loss as such;

2. The rigid rotational and rigid non-rotational collinear monomers contribute to molecular rigidity and in-plane orientation with a packing of the polymer chains within the same plane, (the resulting densely packed, in-plane oriented polymer segments are believed to provide improved strength properties, e.g., modulus, to the polymer matrix);

3. The rotational inhibitor monomers contain pendant functional groups that inhibit internal aromatic ring rotation via steric hindrance and are believed to suppress dielectric loss as such;

4. Flexible monomers typically will contain aromatic ether linkages with either p,p'- or m,m'-substitution patterns allowing for additional polymer chain flexibility to enable preferential orientations or formation of crystallites out of the plane of the resulting film.

Ordinary skill and experimentation may be necessary in preparing the polyimide films of the present invention, depending upon the particular monomers selected and the particular polyimide film manufacturing process selected in the practice of the present invention.

In one embodiment, the films of the present invention further comprise one or more of the following properties:

1. A dielectric dissipation loss factor, or $D_f$, (at 10 GHz) of less than or equal to 0.005, 0.004, 0.0035, 0.003, 0.0025, 0.002 or 0.0015;

2. A water absorption of less than or equal to 2.0%, 1.5%, 1.35%, 1.25%, 1.2%, 1.0%;

3. A water vapor transport rate of less than or equal to 50, 40, 35, 30, 25, 20, 15 or 10 (g×mil)/(m²×day).

It would be impractical to discuss or describe all possible polyimide film manufacturing processes useful in the practice of the present invention. It should be appreciated that the monomer systems of the present invention are capable of providing the above-described advantageous film properties in a variety of manufacturing processes. The films of the present invention can be manufactured as described herein and can be readily manufactured in any one of many (perhaps countless) ways of those film manufacturers ordinarily skilled in the art using any conventional polyimide film manufacturing technology.

Crankshaft Monomers

In one embodiment, for a crankshaft monomer, a crankshaft-type diamine and/or dianhydride monomer may be used. A crankshaft diamine monomer can include 3,4'-oxydianiline (3,4'-ODA) or a functional derivative thereof. 3,4'-oxydianiline is also sometimes referred to as 3,4'-diaminodiphenyl ether (3,4'-DADE). Other examples of crankshaft monomers include any diamine where an amine is attached to each of two separate benzene rings (whether the benzene ring is substituted, unsubstituted, functionalized or unfunctionalized, and whether it is a single ring, fused with another ring or otherwise), where the benzene rings are the same or different and where the benzene rings are connected by a bridging group between at least one or more other benzene rings. Useful bridging groups include —O—, —N(H)—C(O)—, —S—, —SO2-, —C(O)—, —C(O)O—, —C(CH3)2-, —C(CF3)2-, —C(R,R')— where R and R' are the same or different and are any organic group capable of bonding to a carbon, or the like. Depending upon the structure, the amines may be ortho, meta or para to the bridging group connection. Due to steric hindrance, the meta and para positions are generally preferred.

A crankshaft dianhydride monomer can include 3,3'4,4'-biphenyltetracarboxylic dianhydride (BPDA) or a functional derivative thereof. Other examples include functional derivatives of 3,3',4,4'-biphenyltetracarboxylic dianhydride like a dicarboxylic acid, and lower alcohol esters of the acids. As with crankshaft diamines, other examples of crankshaft dianhydrides include dianhydrides having a bridging group between two aromatic moieties. Useful such bridging groups may include —O—, —N(H)—C(O)—, —S—, —SO2-, —C(O)—, —C(O)O—, —C(CH3)2-, —C(CF3)2-, —C(R,R')— where R and R' are the same or different and are any organic group capable of bonding to a carbon, or the like. Depending upon the structure, the amines may be ortho, meta or para to the bridging group connection. Due to steric hindrance, the meta and para positions are generally preferred. Other examples of crankshaft diamines are ester-containing diamines represented by the following:

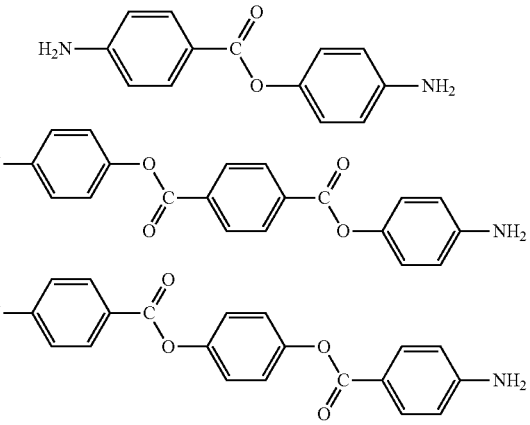

Crankshaft dianhydrides are also possible using a naphthalene based backbone between the anhydride moieties.

Flexible Monomers

In one embodiment, flexible monomers contain a plurality of diphenyl ether and benzophenone linkages. Incorporating these groups significantly increase the coefficient of volume expansion of polyimides because of their rotational freedom and bending motions of the main chains accompanied by large free volumes. The flexibility or rigidity of a monomer can be quantified in terms of the Kier flexibility index (see Kier, L. B., Quant. Struct.-Act. Relat. 8, 221-224 (1989)). This descriptor encodes information pertaining to the number of atoms, cyclicity, heteroatom content, branching and spatial density of the molecule. Larger flexibility indices indicate more rotational freedom. As used herein, the term "flexible monomer" is intended to mean monomers with a Kier flexibility of from about 7.0 to about 14.0. Examples of flexible diamines include, but are not limited to, 4,4'-oxydianiline (ODA, 4,4'-ODA), 2,2-bis[4-(4-aminophenoxy)phenyl]propane (BAPP), 1,3-bis(3-aminophenoxy)benzene (133APB, RODA) and 1,3-bis(4-aminophenoxy)benzene (134APB, RODA). An example of a flexible dianhydride is 4,4'-oxydiphthalic anhydride (ODPA).

Rotational Inhibitor Monomers

In one embodiment, rotational inhibitor monomers are selected from compounds containing a restricted rotational isomer, namely 2,2'-substituted benzidines. The steric hindrance of the 2,2' substituted benzidines contribute to a high rotational barrier to the polyimide chains during the glass transition state. Since the pendant groups exist at the 2,2' prime positions, the most probable conformations for these diamines are around 90° and 270°. Namely, the two phenylene rings are almost perpendicular to each other in the polyimides they comprise. Furthermore, the rotational angle distributions of the most probable conformations are very narrow indicative of very small degrees of rotational freedom along the benzidine phenyl-phenyl bond linkage with any rotation accompanied by a significant energetic penalty. Should the rotation proceed any further, the 2,2' substituents quickly come into contact with the neighboring phenylene ring. Therefore, the angles of 90 and 270° are nearly locked-in positions for the diamine. As a result, one can conclude it is not possible for a phenylene with a substituent in the 2 or 2' position to independently rotate to a large extent around phenyl-phenyl bond linkage. Examples of rotational inhibitor monomers are 2,2'-dimethyl-4,4'-diaminodiphenyl (MTB) and 2,2'-bis(trifluoromethyl)benzidine (TFMB). Although rotational inhibitor monomers have a Kier flexibility of from about 7.0 to about 10.0, for the purposes of the present invention, these monomers are identified as rotational inhibitor monomers and not more broadly as flexible monomers.

Rigid Rotational and Non-Rotational Monomers

In one embodiment, a rigid rotational monomer is selected from "collinear" type monomers. A "Collinear monomer" is intended to mean a polyimide monomer (either dianhydride or diamine) having a dominant rod-like conformation, at least when polymerized into a substantially rod-like (e.g., linear and rigid) polymer chain segment or a matrix of substantially rod-like polymer chain segments. Hence, the collinear monomer will have reactive ends (used to link the monomer into a polymeric backbone structure upon polymerization) that are anti-parallel and substantially linear. Presumably, collinear monomers (when polymerized between two other monomers) form a pair of collinear, anti-parallel nitrogen-benzene imide linkages on each side of the polymerized monomer. Typically, these monomers have para-para' substitution patterns. In addition, rigid rotational monomers have low B-relaxation temperatures and smaller rotational barriers for pi flip oscillations, allowing for rotation of the aromatic ring. The secondary (subglass) main-chain β-relaxation process involves local motions of the polymer chain backbone, such as phenyl ring flips, that do not require cooperative motion of surrounding chains and that the main-chain β-relaxation process is a precursor for the primary α-(glass) relaxation process. Examples of collinear monomers that are rigid rotational monomers are p-phenylenediamine (PPD) and 5-amino-2-(p-aminophenyl) benzoxazole (P-DAMBO, PIBO).

In one embodiment, a rigid non-rotational monomer may be selected from "collinear" type monomers which may or may not be anti-parallel. These monomers typically have higher relative β-relaxation temperatures and resultantly higher rotational barriers for pi flip oscillations effectively freezing any local polyimide chain motion. Examples of rigid non-rotational monomers are pyromellitic dianhydride (PMDA) and 1,3-diaminobenzene (MPD).

In one embodiment, rigid non-rotational monomers can include 1,5-diaminonaphthalene, dibromopyromellitic dianhydride, 3,4,9,10-perylenetetracarboxylic dianhydride, naphthalene-1,4,5,8-tetracarboxylic dianhydride, 1,6-diaminopyrene and 3,6-diaminocarbazole.

Rigid rotational and non-rotational monomers have a Kier flexibility of less than about 6.0.

Regardless of the monomers used, aromatic polyimide chains consist of electron-dense and relatively electron-poor regions, which arise from aromatic diamine and dianhydride moieties, respectively. It is believed that electronic polarization can occur between these groups. Intermolecular charge polarization occurs when a group in one chain donates some of its electron density to an electron-deficient group in another chain. This phenomenon is called "charge transfer complexation".

Due to the stiffness of linear rigid-rod and segmented rigid-rod polyimides, chain-chain interactions can occur over several consecutive repeat units. Consequently, the segments can become aligned along their axes. It is believed that this alignment contributes to the formation of short-range order and crystallinity. An accurate physical picture has not yet been developed for chain-chain interactions comprising charge-transfer and crystalline-type interactions. Polyimides containing amorphous and crystalline (or "ordered") regions are known as two-phase or semi-crystalline polymers. Two-phase linear thermoplastic polyimides are known for high $T_g$'s, excellent solvent resistance and resistance to thermal/mechanical distortion at temperatures just above $T_g$. Due to these outstanding properties, several commercially available polyimides in this category have found widespread use as interlayer dielectrics in electronic packaging.

Other Co-Monomers

In one embodiment, additional co-monomers can be used in synthesizing polyimide polymers, provided that the additional co-monomers are less than 30, 25, 20, 15, 10, 5, 2, 1 or 0.5 mole percent of the final polyimide polymer. To the extent the below monomers do not otherwise fit within one of the definitions for the monomers outlined above, any of the following are examples that may be used as an additional co-monomer for embodiments of the present invention:

2,3,6,7-naphthalene tetracarboxylic dianhydride;
1,2,5,6-naphthalene tetracarboxylic dianhydride;
benzidine;
substituted benzidine (e.g., 2,2'-bis(trifluoromethylbenzidine)
2,3,3',4'-biphenyl tetracarboxylic dianhydride;
2,2',3,3'-biphenyl tetracarboxylic dianhydride;
3,3',4,4'-benzophenone tetracarboxylic dianhydride;
2,3,3',4'-benzophenone tetracarboxylic dianhydride;
2,2',3,3'-benzophenone tetracarboxylic dianhydride;
2,2-bis(3,4-dicarboxyphenyl) propane dianhydride;
bis(3,4-dicarboxyphenyl) sulfone dianhydride;
1,1-bis(2,3-dicarboxyphenyl) ethane dianhydride;
1,1-bis(3,4-dicarboxyphenyl) ethane dianhydride;
bis(2,3-dicarboxyphenyl) methane dianhydride;
bis(3,4-dicarboxyphenyl) methane dianhydride;
4,4'-(hexafluoroisopropylidene) diphthalic anhydride oxydiphthalic dianhydride;
bis(3,4-dicarboxyphenyl) sulfone dianhydride;
bis(3,4-dicarboxyphenyl) sulfoxide dianhydride;
thiodiphthalic dianhydride;
2,2 bis-(4-aminophenyl) propane;
4,4'-diamino diphenyl methane;
4,4'-diamino diphenyl sulfide;
3,3'-diamino diphenyl sulfone;

4,4'-diamino diphenyl sulfone;
4,4'-diamino diphenyl ether;
1,5-diamino naphthalene;
4,4'-diamino-diphenyl diethylsilane;
4,4'-diamino diphenylsilane;
4,4'-diamino diphenyl ethyl phosphine oxide;
4,4'-diamino diphenyl N-methyl amine;
4,4'-diamino diphenyl-N-phenyl amine;
1,3-diaminobenzene;
1,2-diaminobenzene;
2,2-bis(4-aminophenyl) 1,1,1,3,3,3-hexafluoropropane;
2,2-bis(3-aminophenyl) 1,1,1,3,3,3-hexafluoropropane;
and the like.

Any one of a number of polyimide manufacturing processes may be used to prepare polyimide for polymer films. It would be impossible to discuss or describe all possible manufacturing processes useful in the practice of the present invention. It should be appreciated that the monomer systems of the present invention are capable of providing the above-described advantageous properties in a variety of manufacturing processes. The compositions of the present invention can be manufactured as described herein and can be readily manufactured in any one of many (perhaps countless) ways of those of ordinarily skilled in the art, using any conventional or non-conventional manufacturing technology.

Although methods and materials similar or equivalent to those described herein can be used in the practice or testing of the present invention, suitable methods and materials are described herein.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In describing certain polymers, it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers or that amount of the monomers, and the corresponding polymers and compositions thereof.

The materials, methods, and examples herein are illustrative only and, except as specifically stated, are not intended to be limiting.

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Organic Solvents

Useful organic solvents for the synthesis of the polymers of the present invention are preferably capable of dissolving the polymer precursor materials. Such a solvent should also have a relatively low boiling point, such as below 225° C., so the polymer can be dried at moderate (i.e., more convenient and less costly) temperatures. A boiling point of less than 210, 205, 200, 195, 190, or 180° C. is preferred.

Solvents of the present invention may be used alone or in combination with other solvents (i.e., cosolvents). Useful organic solvents include: N-methylpyrrolidone (NMP), dimethylacetamide (DMAc), N,N'-dimethyl-formamide (DMF), dimethyl sulfoxide (DMSO), tetramethyl urea (TMU), diethyleneglycol diethyl ether, 1,2-dimethoxyethane (monoglyme), diethylene glycol dimethyl ether (diglyme), 1,2-bis-(2-methoxyethoxy) ethane (triglyme), bis[2-(2-methoxyethoxy) ethyl)] ether (tetraglyme), gamma-butyrolactone, and bis-(2-methoxyethyl) ether, tetrahydrofuran. In one embodiment, preferred solvents include N-methylpyrrolidone (NMP) and dimethylacetamide (DMAc).

Co-solvents can generally be used at about 5 to 50 weight percent of the total solvent, and useful such co-solvents include xylene, toluene, benzene, "Cellosolve" (glycol ethyl ether), and "Cellosolve acetate" (hydroxyethyl acetate glycol monoacetate).

Polymer Films

In one embodiment, a polymer film having a polyimide can be produced by combining a diamine and a dianhydride (monomer or other polyimide precursor form) together with a solvent to form a polyamic acid (also called a polyamide acid) solution. The dianhydride and diamine can be combined in a molar ratio of about 0.90 to 1.10. The molecular weight of the polyamic acid formed therefrom can be adjusted by adjusting the molar ratio of the dianhydride and diamine.

In one embodiment, a polyamic acid casting solution is derived from the polyamic acid solution. The polyamic acid casting solution preferably comprises the polyamic acid solution can optionally be combined with conversion chemicals like: (i) one or more dehydrating agents, such as, aliphatic acid anhydrides (acetic anhydride, etc.) and/or aromatic acid anhydrides; and (ii) one or more catalysts, such as, aliphatic tertiary amines (triethyl amine, etc.), aromatic tertiary amines (dimethyl aniline, etc.) and heterocyclic tertiary amines (pyridine, picoline, isoquinoline, etc.). The anhydride dehydrating material it is often used in molar excess compared to the amount of amide acid groups in the polyamic acid. The amount of acetic anhydride used is typically about 2.0-4.0 moles per equivalent (repeat unit) of polyamic acid. Generally, a comparable amount of tertiary amine catalyst is used. Nanoparticles, dispersed or suspended in solvent as described above, are then added to the polyamic acid solution.

In one embodiment, the polyamic acid solution, and/or the polyamic acid casting solution, is dissolved in an organic solvent at a concentration from about 5.0 or 10% to about 15, 20, 25, 30, 35 and 40% by weight.

The polyamic acid (and casting solution) can further comprise any one of a number of additives, such as processing aids (e.g., oligomers), antioxidants, light stabilizers, flame retardant additives, anti-static agents, heat stabilizers, ultraviolet absorbing agents, inorganic fillers or various reinforcing agents. Inorganic fillers can include thermally conductive fillers, metal oxides, inorganic nitrides and metal carbides, and electrically conductive fillers like metals, graphitic carbon and carbon fibers. Common inorganic fillers are alumina, silica, silicon carbide, diamond, clay, talc, boron nitride, aluminum nitride, titanium dioxide, dicalcium phosphate, and fumed metal oxides. Common organic fillers include polyaniline, polythiophene, polypyrrole, polyphenylenevinylene, polydialkylfluorenes, carbon black, graphite, multiwalled and single walled carbon nanotubes and carbon nanofibers. In one embodiment, the polymer film can contain up to about 20 wt % of a filler and still maintain good low-loss properties.

The solvated mixture (the polyamic acid casting solution) can then be cast or applied onto a support, such as an endless belt or rotating drum, to give a film. In one embodiment, the polyamic acid can be solution cast in the presence of an imidization catalyst. Use of an imidization catalyst can help to lower the imidization temperature and shorten the imidization time, and can also help in the formation of refractive index-matching nanoparticle aggregates that essentially maintain the volume ratio of low and high index nanoparticles in the aggregate. Typical imidization catalysts can range from bases such as imidazole, 1-methylimidazole, 2-methylimidazole, 1,2-dimethylimidazole, 2-phenylimidazole, benzimidazole, isoquinoline, or substituted pyridines such as methyl pyridines, lutidine, and trialkylamines. Combinations of the tertiary amines with acid anhydrides can be used. These dehydration agents, which can act as co-catalysts, include acetic anhydride, propionic anhydride, n-butyric anhydride, benzoic anhydride and others. The ratio of these catalysts and their concentration in the polyamic acid layer will influence imidization kinetics and the film properties. Next, the solvent containing-film can be converted into a self-supporting film by heating at an appropriate temperature (thermal curing) together with conversion chemical reactants (chemical curing). The film can then be separated from the support, oriented such as by tentering, with continued thermal and chemical curing to provide a polyimide film.

Useful methods for producing polymer films containing a polyimide in accordance with the present invention can be found in U.S. Pat. Nos. 5,166,308 and 5,298,331, which are incorporate by reference into this specification for all teachings therein. Numerous variations are also possible, such as, (a) A method wherein the diamine components and dianhydride components are preliminarily mixed together and then the mixture is added in portions to a solvent while stirring.

(b) A method wherein a solvent is added to a stirring mixture of diamine and dianhydride components. (contrary to (a) above)

(c) A method wherein diamines are exclusively dissolved in a solvent and then dianhydrides are added thereto at such a ratio as allowing to control the reaction rate.

(d) A method wherein the dianhydride components are exclusively dissolved in a solvent and then amine components are added thereto at such a ratio to allow control of the reaction rate.

(e) A method wherein the diamine components and the dianhydride components are separately dissolved in solvents and then these solutions are mixed in a reactor.

(f) A method wherein the polyamic acid with excessive amine component and another polyamic acid with excessive dianhydride component are preliminarily formed and then reacted with each other in a reactor, particularly in such a way as to create a non-random or block copolymer.

(g) A method wherein a specific portion of the amine components and the dianhydride components are first reacted and then the residual diamine components are reacted, or vice versa.

(h) A method wherein the conversion chemicals (catalysts) are mixed with the polyamic acid to form a polyamic acid casting solution and then cast to form a gel film.

(i) A method wherein the components are added in part or in whole in any order to either part or whole of the solvent, also where part or all of any component can be added as a solution in part or all of the solvent.

(j) A method of first reacting one of the dianhydride components with one of the diamine components giving a first polyamic acid. Then reacting another dianhydride component with another amine component to give a second polyamic acid. Then combining the amic acids in any one of a number of ways prior to film formation.

In one embodiment, if the polyimide is soluble in a non-protic solvent, such as DMAc or NMP, the polyimide can be formed in solution, optionally with the addition of catalysts at higher temperatures (>50° C.). After filtration, the polyimide powder can be re-dissolved in a solvent. The polyimide solution can then be cast onto a support (e.g. a moving belt or rigid support) and coalesced to create a polyimide film.

The thickness of the polymer film may be adjusted, depending on the intended purpose of the film or final application specifications. In one embodiment, the polymer film has a total thickness in a range of from about 10 to about 150 μm, or from about 10 to about 80 μm, or from about 10 to about 25 μm, or from about 15 to about 25 μm.

Metal-Clad Laminates

In one embodiment, a conductive layer of the present invention can be created by:
 i. metal sputtering (optionally, then electroplating);
 ii. foil lamination; and/or
 iii. any conventional or non-conventional method for applying a thin metallic layer to a substrate.

Metal-clad laminates can be formed as single-sided laminates or double-sided laminates by any number of well-known processes. In one embodiment, a lamination process may be used to form a metal-clad laminate with a polymer film, such as a multilayer film. In one embodiment, a first outer layer including a first thermoplastic polyimide is placed between a first conductive layer and a core layer, and a second outer layer including a second thermoplastic polyimide is placed on the opposite side of the core layer. In one embodiment, a second conductive layer is placed in contact with the second outer layer on a side opposite the core layer. One advantage of this type of construction is that the lamination temperature of the multilayer film is lowered to the lamination temperature necessary for the thermoplastic polyimide of the outer layer to bond to a conductive layer(s). In one embodiment, the conductive layer(s) is a metal layer(s).

For example, prior to the step of applying a polymer film onto a metal foil, the polymer film can be subjected to a pre-treatment step. Pre-treatment steps can include, heat treatment, corona treatment, plasma treatment under atmospheric pressure, plasma treatment under reduced pressure, treatment with coupling agents like silanes and titanates, sandblasting, alkali-treatment, acid-treatments, and coating polyamic acids. To improve the adhesion strength, it is generally also possible to add various metal compounds as disclosed in U.S. Pat. Nos. 4,742,099; 5,227,244; 5,218,034; and 5,543,222, incorporated herein by reference.

In addition, (for purposes of improving adhesion) the conductive metal surface may be treated with various organic and inorganic treatments. These treatments include using silanes, imidazoles, triazoles, oxide and reduced oxide treatments, tin oxide treatment, and surface cleaning/roughening (called micro-etching) via acid or alkaline reagents.

In a further embodiment, the polyamic acid precursor (to a polyimide film of the present invention) may be coated on a fully cured polyimide base film or directly on a metal substrate and subsequently imidized by heat treatment. The polyimide base film may be prepared by either a chemical or thermal conversion process and may be surface treated, e.g. by chemical etching, corona treatment, laser etching etc., to improve adhesion.

As used herein, the term "conductive layers" and "conductive foils" mean metal layers or metal foils (thin compositions having at least 50% of the electrical conductivity of a high-grade copper). Conductive foils are typically metal foils. Metal foils do not have to be used as elements in pure form; they may also be used as metal foil alloys, such as copper alloys containing nickel, chromium, iron, and other metals. The conductive layers may also be alloys of metals and are typically applied to the polyimides of the present invention via a sputtering step followed by an electro-plating step. In these types of processes, a metal seed coat layer is first sputtered onto a polyimide film. Finally, a thicker coating of metal is applied to the seed coat via electro-plating or electro-deposition. Such sputtered metal layers may also be hot pressed above the glass transition temperature of the polymer for enhanced peel strength.

Particularly suitable metallic substrates are foils of rolled, annealed copper or rolled, annealed copper alloy. In many cases, it has proved to be advantageous to pre-treat the metallic substrate before coating. This pre-treatment may include, but is not limited to, electro-deposition or immersion-deposition on the metal of a thin layer of copper, zinc, chrome, tin, nickel, cobalt, other metals, and alloys of these metals. The pre-treatment may consist of a chemical treatment or a mechanical roughening treatment. It has been found that this pre-treatment enables the adhesion of the polyimide layer and, hence, the peel strength to be further increased. Apart from roughening the surface, the chemical pre-treatment may also lead to the formation of metal oxide groups, enabling the adhesion of the metal to a polyimide layer to be further increased. This pre-treatment may be applied to both sides of the metal, enabling enhanced adhesion to substrates on both sides.

In one embodiment, a metal-clad laminate can include the polymer film that is a multilayer film and a first metal layer adhered to an outer surface of the first outer layer of the multilayer film. In one embodiment, a metal-clad laminate can include a second metal layer adhered to an outer surface of the second outer layer of the multilayer film. In one embodiment, the first metal layer, the second metal layer or both metal layers can be copper. In one embodiment, a metal-clad laminate of the present invention comprising a double side copper-clad can be prepared by laminating copper foil to both sides of the multilayer film.

In another embodiment, the polymer films of the present invention are used as a material to construct a planar transformer component. These planar transformer components are commonly used in power supply devices.

In yet another embodiment, the polymer films of the present invention may be used with thick metal foils to form flexible heaters. These heaters are typically used in automotive and aerospace applications.

The polymer films of the present invention exhibit excellent attenuation. The polyimides of the present invention can often exhibit an attenuation value, measured in decibels per inch, of about 0.3 at 10 GHz using a 50 ohm micro strip.

In one embodiment, a polyimide precursor for a core layer and polyimide precursors for first and second outer layers are cast simultaneously (using a multi-port die) to form a multilayer polyimide film (after curing of the polyamic acid layers). This multilayer film is then bonded to metal layer(s) using the thermoplastic polyimide of the outer layer(s) as the bonding layer to the metal layer(s). Thus, a multilayer film metal-clad laminate formed comprises the multilayer film and at least one conductive layer. Bonding of the multilayer polyimide/metal-clad laminates, when a metal foil is used as the conductive layer, can take place in a double belt press in roll to roll processing, or in an autoclave in sheet to sheet processing.

Applications

In one embodiment, polymer films having polyimides with low dielectric dissipation loss factors can be used in a variety of electronic devices where low-loss is required or advantageous. The emergence of applications using millimeter waves has been increasing and has encouraged the development of new low-loss dielectric materials that can enhance signal integrity and increase area of coverage in several key market segments. In the consumer electronics segment, the next generation of wireless networks, called "5G", will benefit from low-loss flexible dielectrics in antenna feedline and digital input/output circuit fabrication. In the military and aerospace segment, high data throughputs will be enhanced using low loss dielectrics for radar, antennas, unmanned air vehicle sensors, satellite communications, and real-time video transmission.

In one embodiment, the polymer films of the present invention are useful for die pad bonding of flexible print connection boards or semiconductor devices or packaging materials for CSP (chip scale package), chip on flex (COF), COL (chip on lead), LOC (lead on chip), multi-chip module ("MCM"), ball grid array ("BGA" or micro-ball grid array), and/or tape automated bonding ("TAB").

In another embodiment, the polymer films of the present invention may be used for wafer level integrated circuit packaging, where a composite is made using a polymer film according to the present invention interposed between a conductive layer (typically a metal) having a thickness of less than 100 μm, and a wafer comprising a plurality of integrated circuit dies. In one (wafer level integrated circuit packaging) embodiment, the conductive passageway is connected to the dies by a conductive passageway, such as a wire bond, a conductive metal, a solder bump or the like.

The advantageous properties of this invention can be observed by reference to the following examples that illustrate, but do not limit, the invention. All parts and percentages are by weight unless otherwise indicated.

EXAMPLES

Test Methods

Dielectric Constant and Dissipation Loss Factor

The relative complex permittivity (dielectric constant $(D_k)$ and dissipation factor $(D_f)$) of a material is measured in accordance with ASTM method D2520-13. The samples were prepared using standard conditioning practices which include a pre-bake at 121° C. for 2 hr along with a conditioning step in which the sample is contained in an environmental chamber/conditioned lab. The temperature within this containment is 23° C. (±1-5° C.) with a relative humidity (RH) of 50% RH (±5% RH) for 24 hrs.

Water Vapor Transmission Rate

The term "vapor transmission rate" is a measure of the rate at which water or another vapor is released (transmitted) through a film. Typically, water is absorbed into a polyimide film from the inherent humidity in an ambient environment.

The water vapor transmission rate (WVTR) of a polyimide film is measured in accordance with ASTM method F-1249. The units of measure on WVTR are grams of water per day multiplied by the film thickness per square meter of film. This is a calculated number based upon film thickness and water vapor transmission rate. The films were run at 37.8° C. at 100% relative humidity (RH).

Water Uptake

Thermogravimetric analysis (TGA) is the continuous measurement of weight loss of a specimen as the temperature is increased at a specific rate. Water uptake was measured using a TA-3000 thermal analyzer (Mettler Toledo, Columbus, Ohio). Water absorption of polyimide films was determined by placing strips of film in distilled water for 24 hours at room temperature. The film samples were run and analyzed for water content by thermal gravimetric analysis at a rate of 10° C./minute between room temperature and 400° C. and analyzed from RT to 160° C. and 160° C. to 400° C.

Thickness

Coating thickness was determined by measuring coated and uncoated samples in 5 positions across the profile of the film using a contact-type FISCHERSCOPE MMS PC2 modular measurement system thickness gauge (Fisher Technology Inc., Windsor, Conn.).

Polymer Synthesis

All of the polymers for Examples 1 to 84 and Comparative Examples 1 to 7 were synthesized in a similar manner, but using different combinations of monomers. For example, a five-monomeric system, Example 60 (E60) was made as follows.

In a 300 ml jacketed beaker held at 45° C., purged in a nitrogen glove box, 3.512 g (0.03248 mol) of p-phenylenediamine (PPD) was added to 90.00 g of DMAc solvent (HPLC grade, Honeywell, USA). Once the PPD was fully dissolved, 4.316 g (0.01476 mol) of 1,3-bis-(4-aminophenoxy) benzene (APB-134, RODA) and 2.508 g (0.01181 mol) of 2,2'-dimethyl-4,4'-diaminobiphenyl (MTB) were added sequentially. Each bottle was rinsed with an amount of DMAc. 15.376 g (0.052264 mol) of 3,3',4,4'-biphenyl tetracarboxylic dianhydride (BPDA) and 1.288 g (0.0059056 mol) of pyromellitic dianhydride (PMDA) were combined to make an admixture. Once mixed, the mixture was slowly added to the diamine solution over a 45-minute time period while being continuously stirred. An amount of DMAc was used to rinse the dianhydride bottles and poured into the starting polyamic acid. The remainder of DMAc was added to make a total amount of DMAc to the mixture 123 g. The heating source was removed from the jacketed beaker (re-circulator was turned off) for the remainder of the synthesis. The polyamic acid mixed for several hours and was then "finished" to ~500 poise (+/−50 poise) using small additions of 6 wt % PMDA solution in DMAc. The polymer was de-gassed using a centrifugal-planetary mixer (THINKY USA, Laguna Hills, Calif.) to force the gas from the pre-polymer at 2000 rpm for 5 minutes followed by 2200 rpm for 10 minutes. This procedure was repeated if further de-gassing of the polymer was needed.

For a polymer film with filler, Example 84 (E84), the procedure of E60 was followed, with the addition of the filler being made after all of the diamines were dissolved in DMAc. 7.2 g of talc (Fuji Talc Industrial Co., Ltd., Japan) was added and allowed to mix for 60 minutes, followed by rinsing with DMAc and then the addition of the dianhydrides.

Films were made by casting the pre-polymer onto a glass surface using a stainless-steel drawdown bar. The clearance was adjusted using Scotch™ 898 tape to adjust the clearance. The film was heated to a temperature in the range of from about 85 to about 150° C. for 15 to 25 minutes and was subsequently lifted off the glass surface and mounted onto an 8×10 inch pin frame or a 12×12 inch pin frame. The mounted film was placed in a furnace and heated to a temperature in the range of from about 150 to about 400° C. to fully imidize the film, and then removed and allowed to cool in air.

Examples 1 to 14 (E1-E14) demonstrate three-monomeric systems using the monomers as shown in Tables 1 to 3. More specifically, E1-E4 illustrate suitable concentrations of rigid non-rotational, crankshaft and flexible monomers. E5-E10 incorporate a different combination set using crankshaft or flexible, rigid rotational and rotational inhibitor. E11-E14 illustrate an appropriate combination using a different combination set, crankshaft, flexible and rigid rotational monomers.

TABLE 1

| | Dielectric Loss @ 10 GHz | Water Uptake % | WVTR (g × mil)/ (m² × day) | Rigid Non-Rotational PMDA | Crankshaft BPDA | Flexible | |
|---|---|---|---|---|---|---|---|
| | | | | | | RODA | BAPP |
| E1 | 0.0022 | 0.785 | 10.0 | 10 | 40 | | 50 |
| E2 | 0.0025 | 0.775 | 12.4 | 25 | 25 | | 50 |
| E3 | 0.0031 | 0.654 | 5.94 | 10 | 40 | 50 | |
| E4 | 0.0048 | 1.000 | 14.0 | 25 | 25 | 50 | |

TABLE 2

| | Dielectric Loss @ 10 GHz | Water Uptake % | WVTR (g × mil)/ (m² × day) | Crankshaft BPDA | Flexible ODPA | Rigid Rotational PPD | Rigid Rotational DAMBO | Rotational Inhibitor MTB | Rotational Inhibitor TFMB |
|---|---|---|---|---|---|---|---|---|---|
| E5 | 0.0030 | 1.00 | 3.43 | 50 | | 32.5 | | 17.5 | |
| E6 | 0.0032 | 0.831 | 10.0 | 50 | | | 20 | | 30 |
| E7 | 0.0021 | 0.679 | 4.16 | 50 | | | 20 | 30 | |
| E8 | 0.0034 | 1.10 | 2.04 | 50 | | 40 | | 10 | |
| E9 | 0.0027 | 0.976 | 2.17 | 50 | | 25 | | 25 | |
| E10 | 0.0027 | 0.890 | 5.72 | | 50 | 35 | | 15 | |

TABLE 3

| | Dielectric Loss @ 10 GHz | Water Uptake % | WVTR (g × mil)/ (m² × day) | Crankshaft BPDA | Crankshaft 3,4-ODA | Flexible ODA | Rigid Rotational PPD |
|---|---|---|---|---|---|---|---|
| E11 | 0.0050 | 1.21 | 9.23 | 50 | | 25 | 25 |
| E12 | 0.0039 | 1.10 | 8.87 | 50 | | 35 | 15 |
| E13 | 0.0034 | 1.11 | 3.87 | 50 | 25 | | 25 |
| E14 | 0.0025 | 0.880 | 2.92 | 50 | 35 | | 15 |

Examples 15 to 52 demonstrate four-monomeric systems using the monomers as shown in Tables 4 to 7. More specifically, E15-E 27 and E29-E43 illustrate appropriate concentrations and combinations that incorporate monomers from the crankshaft, flexible, rigid rotational and rotational inhibitor categories. E28 and E45-E47 illustrate appropriate concentrations and combinations that incorporate monomers from the crankshaft, rigid non-rotational, rigid rotational and rotational inhibitor categories. E44 and E48-E52 illustrate appropriate concentrations and combinations that incorporate monomers from the crankshaft, rigid non-rotational, rigid rotational and flexible categories.

TABLE 4

| | Dielectric Loss @ 10 GHz | Water Uptake % | WVTR (g × mil)/ (m² × day) | Crankshaft BPDA | Rigid Non-Rotational PMDA | Flexible BPADA | Flexible RODA | Flexible BAPP | Rigid Rotational PPD | Rotational Inhibitor MTB |
|---|---|---|---|---|---|---|---|---|---|---|
| E15 | 0.0024 | 0.732 | 3.02 | 50 | | | 12.5 | | 27.5 | 10 |
| E16 | 0.0023 | 0.859 | 2.26 | 50 | | | 10 | | 30 | 10 |
| E17 | 0.0040 | 1.18 | 3.46 | 50 | | | 7.5 | | 32.5 | 10 |
| E18 | 0.0024 | 0.872 | 7.19 | 50 | | | 5 | | 32.5 | 12.5 |
| E19 | 0.0033 | 0.949 | 2.41 | 50 | | | 5 | | 37.5 | 7.5 |
| E20 | 0.0036 | 1.10 | 2.57 | 50 | | | 5 | | 40 | 5 |
| E21 | 0.0040 | 0.982 | 2.70 | 50 | | | 5 | | 42.5 | 2.5 |
| E22 | 0.0046 | 1.16 | 7.49 | 50 | | | | 5 | 37.5 | 7.5 |
| E23 | 0.0050 | 1.17 | 11.5 | 50 | | | | 5 | 40 | 5 |
| E24 | 0.0083 | 1.42 | 9.20 | 50 | | | | 5 | 42.5 | 2.5 |
| E25 | 0.0042 | 1.19 | 14.0 | 50 | | | | 7.5 | 32.5 | 10 |
| E26 | 0.0044 | 1.13 | 13.7 | 50 | | | | 10 | 32.5 | 7.5 |
| E27 | 0.0047 | 1.20 | 24.1 | 50 | | | | 12.5 | 32.5 | 5 |
| E28 | 0.0031 | 0.946 | 2.14 | 45 | 5 | | | | 32.5 | 17.5 |
| E29 | 0.0044 | 1.45 | 19.2 | 45 | | 5 | | | 40 | 10 |
| E30 | 0.0036 | 1.05 | 18.7 | 35 | | 15 | | | 40 | 10 |

TABLE 5

| | Dielectric Loss @ 10 GHz | Water Uptake % | WVTR (g × mil)/ (m² × day) | Crankshaft BPDA | Flexible ODPA | Rigid Rotational PPD | Rotational Inhibitor MTB |
|---|---|---|---|---|---|---|---|
| E31 | 0.0025 | 1.18 | 2.40 | 20 | 30 | 35 | 15 |
| E32 | 0.0029 | 1.05 | 2.05 | 20 | 30 | 40 | 10 |
| E33 | 0.0030 | 1.01 | 1.59 | 20 | 30 | 45 | 5 |
| E34 | 0.0041 | 1.27 | 1.92 | 25 | 25 | 35 | 15 |
| E35 | 0.0036 | 1.11 | 7.75 | 30 | 20 | 35 | 15 |
| E36 | 0.0028 | 0.972 | 1.92 | 30 | 20 | 20 | 30 |
| E37 | 0.0035 | 0.998 | 1.40 | 30 | 20 | 30 | 20 |
| E38 | 0.0023 | 0.882 | 1.84 | 30 | 20 | 40 | 10 |
| E39 | 0.0029 | 1.01 | 1.56 | 30 | 20 | 45 | 5 |

TABLE 6

| | Dielectric Loss @ 10 GHz | Water Uptake % | WVTR (g × mil)/ (m² × day) | Crankshaft BPDA | Flexible ODA | Flexible BAPP | Rigid Rotational PPD | Rotational Inhibitor MTB |
|---|---|---|---|---|---|---|---|---|
| E40 | 0.0033 | 1.18 | 3.00 | 50 | 5 | | 35 | 10 |
| E41 | 0.0035 | 1.09 | 3.14 | 50 | 10 | | 35 | 5 |
| E42 | 0.0039 | 1.16 | 2.23 | 50 | | 5 | 37.5 | 7.5 |
| E43 | 0.0041 | 0.823 | 7.87 | 50 | | 7.5 | 32.5 | 10 |

TABLE 7

| | Dielectric Loss @ 10 GHz | Water Uptake % | WVTR (g × mil)/ (m² × day) | Rigid Non-Rotational PMDA | Crankshaft BPDA | Crankshaft 3,4'-ODA | Rigid Rotational PPD | Rotational Inhibitor MTB | Flexible RODA | Flexible ODA |
|---|---|---|---|---|---|---|---|---|---|---|
| E44 | 0.0046 | 1.19 | 0.987 | 12 | 88 | | 95 | | | 5 |
| E45 | 0.0042 | 1.17 | 2.99 | 12 | 88 | | 95 | 5 | | |
| E46 | 0.0037 | 1.30 | 2.43 | 12 | 88 | | 90 | 10 | | |
| E47 | 0.0025 | 1.08 | 2.68 | 12 | 88 | | 80 | 20 | | |
| E48 | 0.0046 | 1.30 | 2.41 | 7 | 93 | 5 | 95 | | | |
| E49 | 0.0039 | 1.28 | 2.08 | 17 | 83 | 5 | 95 | | | |
| E50 | 0.0038 | 1.20 | 2.14 | 17 | 83 | | 95 | | 5 | |
| E51 | 0.0040 | 1.11 | 2.78 | 12 | 88 | | 95 | | 5 | |
| E52 | 0.0048 | 1.40 | 4.37 | 7 | 93 | | 95 | | 5 | |

Examples 53 to 81 (E53-E81) demonstrate five-monomeric systems using the monomers as shown in Tables 8 to 10, incorporating monomers from all five categories, rigid non-rotational, crankshaft, flexible, rigid rotational, and rotational inhibitor.

TABLE 8

| | Dielectric Loss @ 10 GHz | Water Uptake % | WVTR (g × mil)/ (m2 × day) | Rigid Non-Rotational PMDA | Rigid Non-Rotational MPD | Crankshaft BPDA | Flexible RODA | Rigid Rotational PPD | Rotational Inhibitor MTB | Rotational Inhibitor TFMB |
|---|---|---|---|---|---|---|---|---|---|---|
| E53 | 0.0030 | 0.982 | 2.42 | 8.5 | | 41.5 | 5 | 32.5 | 12.5 | |
| E54 | 0.0021 | 0.633 | 2.77 | 5 | | 45 | 15.5 | 24.5 | 10 | |
| E55 | 0.0021 | 0.694 | 3.71 | 2.5 | | 47.5 | 12.5 | 27.5 | 10 | |
| E56 | 0.0029 | 0.630 | 9.62 | 5 | | 45 | 12.5 | 27.5 | | 10 |
| E57 | 0.0027 | 0.858 | 7.92 | 15 | 5 | 35 | 12.5 | | 32.5 | |
| E58 | 0.0042 | 1.79 | 2.21 | 5 | | 45 | 7.5 | 32.5 | 10 | |
| E59 | 0.0052 | 1.11 | 2.42 | 10 | | 40 | 7.5 | 32.5 | 10 | |
| E60 | 0.0022 | 0.973 | 2.83 | 5 | | 45 | 12.5 | 27.5 | 10 | |
| E61 | 0.0025 | 0.908 | 8.23 | 10 | | 40 | 12.5 | 27.5 | 10 | |
| E62 | 0.0023 | 0.854 | 2.64 | 5 | | 45 | 10 | 30 | 10 | |
| E63 | 0.0023 | 0.647 | 3.03 | 10 | | 40 | 10 | 30 | 10 | |

TABLE 9

| | Dielectric Loss @ 10 GHz | Water Uptake % | WVTR (g × mil)/ (m2 × day) | Rigid Non-Rotational PMDA | Crankshaft BPDA | Flexible RODA | Flexible BAPP | Rigid Rotational PPD | Rotational Inhibitor MTB |
|---|---|---|---|---|---|---|---|---|---|
| E64 | 0.0037 | 1.16 | 6.24 | 5 | 45 | | 5 | 32.5 | 12.5 |
| E65 | 0.0036 | 1.10 | 10.7 | 5 | 45 | | 10 | 27.5 | 12.5 |
| E66 | 0.0041 | 1.19 | 12.4 | 10 | 40 | | 5 | 32.5 | 12.5 |
| E67 | 0.0068 | 1.58 | 10.4 | 10 | 40 | | 10 | 27.5 | 12.5 |
| E68 | 0.0029 | 0.840 | 2.66 | 5 | 45 | 5 | | 32.5 | 12.5 |
| E69 | 0.0022 | 0.746 | 2.43 | 5 | 45 | 10 | | 27.5 | 12.5 |
| E70 | 0.0032 | 1.42 | 3.18 | 10 | 40 | 5 | | 32.5 | 12.5 |
| E71 | 0.0025 | 0.945 | 1.92 | 10 | 40 | 10 | | 27.5 | 12.5 |

TABLE 10

| | Dielectric Loss @ 10 GHz | Water Uptake % | WVTR (g × mil)/ (m2 × day) | Crankshaft BPDA | ODPA | Flexible BTDA | RODA | BAPP | Rigid Rotational PPD | Rotational Inhibitor TFMB | MTB |
|---|---|---|---|---|---|---|---|---|---|---|---|
| E72 | 0.0041 | 1.11 | 4.75 | 40 | | 10 | 5 | | 35 | | 10 |
| E73 | 0.0038 | 1.17 | 4.46 | 40 | | 10 | 7.5 | | 35 | | 7.5 |
| E74 | 0.0043 | 1.13 | 4.35 | 40 | | 10 | 10 | | 35 | | 5 |
| E75 | 0.0037 | 1.21 | 4.18 | 40 | | 10 | 5 | | 30 | | 15 |
| E76 | 0.0044 | 1.34 | 7.46 | 40 | | 10 | 15 | | 30 | | 5 |
| E77 | 0.0036 | 1.11 | 7.75 | 30 | 20 | | | 7.5 | 32.5 | | 10 |
| E78 | 0.0038 | 0.892 | 9.40 | 30 | 20 | | | 10 | 32.5 | | 10 |
| E79 | 0.0036 | 0.970 | 11.5 | 30 | 20 | | | 12.5 | 27.5 | | 10 |
| E80 | 0.0025 | 0.938 | 4.07 | 30 | 20 | | | | 35 | 5 | 10 |
| E81 | 0.0025 | 1.01 | 4.60 | 30 | 20 | | | | 32.5 | 7.5 | 10 |

Comparative Examples 1 to 9 (CE1-CE9) are shown in Tables 11, 12 and 13. More specifically, CE1-CE4 demonstrate that improper selection of monomers in a three-monomeric system results in polymer films for which the dielectric loss is not sufficiently low. Similarly, CE5-CE8 represent undesirable concentrations of monomers from the rigid non-rotational and flexible categories in four-monomeric systems, and CE9 represents an undesirable concentration of monomers for a five-monomer system.

TABLE 11

| | Dielectric Loss @ 10 GHz | Water Uptake % | Rigid Non-Rotational PMDA | Crankshaft BPDA | Flexible RODA | ODA |
|---|---|---|---|---|---|---|
| CE1 | 0.0089 | 0.977 | 70 | 30 | 100 | |
| CE2 | 0.0133 | 1.70 | 50 | 50 | | 100 |
| CE3 | 0.0078 | 1.37 | 70 | 30 | | 100 |
| CE4 | 0.0216 | 3.09 | 100 | | 70 | 30 |

TABLE 12

| | Dielectric Loss @ 10 GHz | Water Uptake % | Rigid Non-Rotational PMDA | MPD | Flexible RODA | BAPP | ODPA | ODA |
|---|---|---|---|---|---|---|---|---|
| CE5 | 0.0100 | 0.977 | 10 | | 25 | | 40 | 25 |
| CE6 | 0.0750 | 1.70 | 10 | | 40 | | 40 | 10 |
| CE7 | 0.0101 | — | 25 | 25 | | 25 | 25 | |
| CE8 | 0.0092 | — | 15 | 25 | | 25 | 35 | |

TABLE 13

| | Dielectric Loss @ 10 GHz | Water Uptake % | Rigid Non-Rotational PMDA | Crankshaft BPDA | Flexible RODA | Rigid Rotational PPD | Rotational Inhibitor MTB |
|---|---|---|---|---|---|---|---|
| CE9 | 0.0082 | 1.89 | 25 | 25 | 5 | 32.5 | 12.5 |

Examples 82 to 84 (E82-E84), as shown in Table 14, demonstrate that the desired low-loss properties can be maintained, even when adding a large amount of filler, 20 wt % talc filler, to the polymer film. Although the $D_f$ is slightly higher than for the unfilled films, it is still quite low. E82 and E83 are filled versions of the four-monomeric systems of E19 and E16, respectively, and E84 is a filled version of the five-monomeric system of E60.

TABLE 14

|     | System Type # of monomers | Dielectric Loss @ 10 GHz | Water Uptake % |
| --- | --- | --- | --- |
| E82 | 4 | 0.0040 | 0.8 |
| E83 | 4 | 0.0025 | 0.75 |
| E84 | 5 | 0.0030 | 0.5 |

Note that not all of the activities described above in the general description are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. All features disclosed in this specification may be replaced by alternative features serving the same, equivalent or similar purpose. Accordingly, the specification and figures are to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A polymer film comprising a polyimide, wherein the polyimide comprises:
    two or more dianhydrides comprising:
        30 to 49 mol % of a first monomer that is a crankshaft monomer; and
        1 to 20 mol % of a second monomer that is a rigid non-rotational monomer; and
    three or more diamines comprising:
        5 to 35 mol % of a third monomer that is a rotational inhibitor monomer;
        1 to 20 mol % of a fourth monomer that is a flexible monomer; and
        1 to 40 mol % of a fifth monomer that is a rigid rotational monomer or a rigid non-rotational monomer, wherein the mol % of each monomer is based on the total of all five monomers, wherein the polymer film has:
            a dielectric dissipation loss factor $D_f$ of 0.005 or less;
            a water absorption of 2.0% or less; and
            a water vapor transport rate of 50 (g×mil)/(m²×day) or less.

2. The polymer film of claim 1, wherein the polymer film has a thickness in the range of from 10 to 150 μm.

3. A metal-clad laminate comprising the polymer film of claim 1 and a first metal layer adhered to a first outer surface of the polymer film.

4. The metal-clad laminate of claim 3, further comprising a second metal layer adhered to a second outer surface of the polymer film.

5. An electronic device comprising the polymer film of claim 1.

6. The polymer film of claim 1, wherein the crankshaft dianhydride monomer is 3,3',4,4'-biphenyl tetracarboxylic dianhydride or a functional derivative thereof.

7. The polymer film of claim 1, wherein the rigid non-rotational dianhydride monomer is selected from the group consisting of pyromellitic dianhydride, 1,3-diaminobenzene, dibromopyromellitic dianhydride, 3,4,9,10-perylenetetracarboxylic dianhydride, naphthalene-1,4,5,8-tetracarboxylic dianhydride and mixtures thereof.

8. The polymer film of claim 1, wherein the rotational inhibitor diamine monomer is selected from the group consisting of 2,2'-dimethyl-4,4'-diaminodiphenyl, 2,2'-bis(trifluoromethyl)benzidine and mixtures thereof.

9. The polymer film of claim 1, wherein the flexible diamine monomer is selected from the group consisting of 4,4'-oxydianiline, 2,2-bis[4-(4-aminophenoxy)phenyl]propane, 1,3-bis(3-aminophenoxy)benzene, 1,3-bis(4-aminophenoxy)benzene and mixtures thereof.

10. The polymer film of claim 1, wherein the rigid rotational diamine monomer is selected from the group consisting of p-phenylenediamine, 5-amino-2-(p-aminophenyl)benzoxazole and mixtures thereof.

11. The polymer film of claim 1, wherein the rigid non-rotational diamine monomer is selected from the group consisting of 1,5-diaminonaphthalene, 1,6-diaminopyrene, 3,6-diaminocarbazole and mixtures thereof.

12. The polymer film of claim 1, wherein the flexible diamine monomer has a Kier flexibility in the range of from 7.0 to 14.0.

13. The polymer film of claim 1, wherein the polymer film further comprises up to 20 wt % of a filler comprising an inorganic filler, an organic filler or a mixture thereof.

14. The polymer film of claim 1, wherein the polymer film has a dielectric dissipation loss factor $D_f$ of 0.0035 or less.

15. The polymer film of claim 1, wherein the polymer film has a water absorption of 1.25% or less.

16. The polymer film of claim 1, wherein the polymer film has a water vapor transport rate of 15(g×mil)/(m²×day) or less.

* * * * *